United States Patent
Mauder et al.

(10) Patent No.: US 8,614,478 B2
(45) Date of Patent: Dec. 24, 2013

(54) METHOD FOR PROTECTING A SEMICONDUCTOR DEVICE AGAINST DEGRADATION, A SEMICONDUCTOR DEVICE PROTECTED AGAINST HOT CHARGE CARRIERS AND A MANUFACTURING METHOD THEREFOR

(75) Inventors: Anton Mauder, Kolbermoor (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 283 days.

(21) Appl. No.: 12/843,326

(22) Filed: Jul. 26, 2010

(65) Prior Publication Data

US 2012/0018798 A1 Jan. 26, 2012

(51) Int. Cl.
*H01L 29/66* (2006.01)
(52) U.S. Cl.
USPC ............. 257/328; 257/546; 257/E29.006; 257/E21.41; 438/268
(58) Field of Classification Search
USPC ............. 257/328, 546, E29.006, E29.362, 257/E21.41; 438/268
See application file for complete search history.

(56) References Cited

U.S. PATENT DOCUMENTS

| 3,500,142 A | 3/1970 | Kahng |
| 4,173,766 A | 11/1979 | Hayes |
| 6,445,054 B1 | 9/2002 | Traijkovic et al. |
| 6,849,890 B2 * | 2/2005 | Kokubun .............. 257/296 |
| 2006/0138566 A1 | 6/2006 | Chakravarti et al. |
| 2009/0039414 A1 | 2/2009 | Lue et al. |

OTHER PUBLICATIONS

H. Ueda et al., Wide-Bandgap Semiconductor Devices for Automobile Applications, CS MANTECH Conference, Apr. 24-27, 2006, Vancouver, Canada.
B. Hoex et al., Crystalline Silicon Surface Passivation by the Negative-Chart-Dielectric Al2O3, 33 IEEE.

* cited by examiner

*Primary Examiner* — Eugene Lee
*Assistant Examiner* — Elias M Ullah
(74) *Attorney, Agent, or Firm* — Murphy, Bilak & Homiller, PLLC

(57) ABSTRACT

A method for protecting a semiconductor device against degradation of its electrical characteristics is provided. The method includes providing a semiconductor device having a first semiconductor region and a charged dielectric layer which form a dielectric-semiconductor interface. The majority charge carriers of the first semiconductor region are of a first charge type. The charged dielectric layer includes fixed charges of the first charge type. The charge carrier density per area of the fixed charges is configured such that the charged dielectric layer is shielded against entrapment of hot majority charge carriers generated in the first semiconductor region. Further, a semiconductor device which is protected against hot charge carriers and a method for forming a semiconductor device are provided.

12 Claims, 19 Drawing Sheets

METHOD FOR PROTECTING A SEMICONDUCTOR DEVICE AGAINST DEGRADATION, A SEMICONDUCTOR DEVICE PROTECTED AGAINST HOT CHARGE CARRIERS AND A MANUFACTURING METHOD THEREFOR

FIELD OF THE INVENTION

This specification refers to embodiments of methods for protecting a semiconductor device against hot charge carrier induced degradation. Furthermore, this specification refers to embodiments of semiconductor devices, in particular to field effect power semiconductor devices, which are protected against the injection of hot charge carriers into a dielectric region, and a manufacturing method therefor.

BACKGROUND

Many functions of modern devices in automotive, consumer and industrial applications such as converting electrical energy and driving an electric motor or an electric machine rely on semiconductor devices. It is often desirable that the semiconductor devices operate reliably over a long period. A long term high reliability of semiconductor devices is also often expected in consumer electronics, for example in high fidelity audio amplifier circuits. The characteristics of power semiconductor devices such as power transistors used in the amplifier circuit affects the performance of the circuit. It is therefore often desired to prevent or at least delay any degradation of the characteristics such as threshold voltage, blocking voltage, switching time, switching characteristics or amplification.

In particular power semiconductor devices are typically exposed to high loads during operation. For example, a power semiconductor device such as a power IGBT (Insulated Gate Bipolar Transistor) operating in a power converter or as a driver or switch of an electric motor may be exposed to high currents while sweeping-out the excess charge and/or voltages during switching or an operating cycle. In such an event, hot charge carriers, typically hot electrons may be generated in high electric field regions. However, when the hot carriers are injected into a dielectric layer or a field dielectric of the IGBT, degradation of transistor characteristics and even complete circuit failure may occur.

This is not restricted to the active area of power semiconductor devices. Hot carrier injection has also been found to be a reliability risk for edge termination structures in power semiconductor devices. The observed drift of the blocking capability has been attributed to hot electrons which are injected to the dielectric region of edge termination field plates. As the likelihood of hot carrier induced degradation increases with decreasing device dimension, hot-electron-induced degradation is also known to impose limits on the scaling of dielectrics.

In addition, hot-electron-induced degradation of semiconductor devices can often only be detected in sophisticated long-term reliability tests such as high temperature reverse bias tests.

With appropriately poled field plates and/or doped regions the field strength close to the dielectric regions may be reduced. These measures are however not always feasible and imposes design restrictions. For example, using an additional n-doped semiconductor region below a p-doped body region of a MOSFET (Metal-Oxide Semiconductor Field-Effect Transistor) or IGBT results in a reduced blocking voltage.

For these and other reasons there is a need for the present invention.

SUMMARY

According to an embodiment, a method for protecting a semiconductor device against degradation of its electrical characteristics is provided. The method includes providing a semiconductor device having a first semiconductor region and a charged dielectric layer which form a dielectric-semiconductor interface. The majority charge carriers of the first semiconductor region are of a first charge type. The charged dielectric layer includes fixed charges of the first charge type. The charge carrier density per area of the fixed charges is configured such that the charged dielectric layer is shielded against entrapment of hot majority charge carriers generated in the first semiconductor region.

According to an embodiment, a semiconductor transistor having a semiconductor body is provided. The semiconductor body includes a dielectric region and a first semiconductor region with majority charge carriers of a first charge type. The dielectric region includes a first charged dielectric portion and a second charged dielectric portion with fixed charges of the first charge type. The first charged dielectric portion has a first maximum charge carrier density per area. The second charged dielectric portion has a second maximum charge carrier density per area of the fixed charges. The second maximum charge carrier density per area is larger than the first maximum charge carrier density per area. The first semiconductor region forms an insulator-semiconductor interface at least with the second charged dielectric portion.

According to an embodiment, a method for forming a semiconductor device is provided. The method includes providing a semiconductor body having a first semiconductor region. The majority charge carriers of the first semiconductor region are of a first charge type. The method further includes forming a dielectric region having fixed charges of the first charge type and forming an electrode structure next to the dielectric region, such that the electrode structure is insulated from the semiconductor body. The first semiconductor region forms a drift region. The electrode structure forms at least one of a field plate and a gate electrode having a portion which is arranged next to the dielectric region and configured to operate as a field plate. Forming the dielectric region includes forming a first dielectric layer on the first semiconductor region, forming a second layer on the first dielectric layer by atomic layer deposition, and forming a second dielectric layer on the second layer. The dielectric region is formed such that the dielectric region and the first semiconductor region form an insulator-semiconductor interface.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
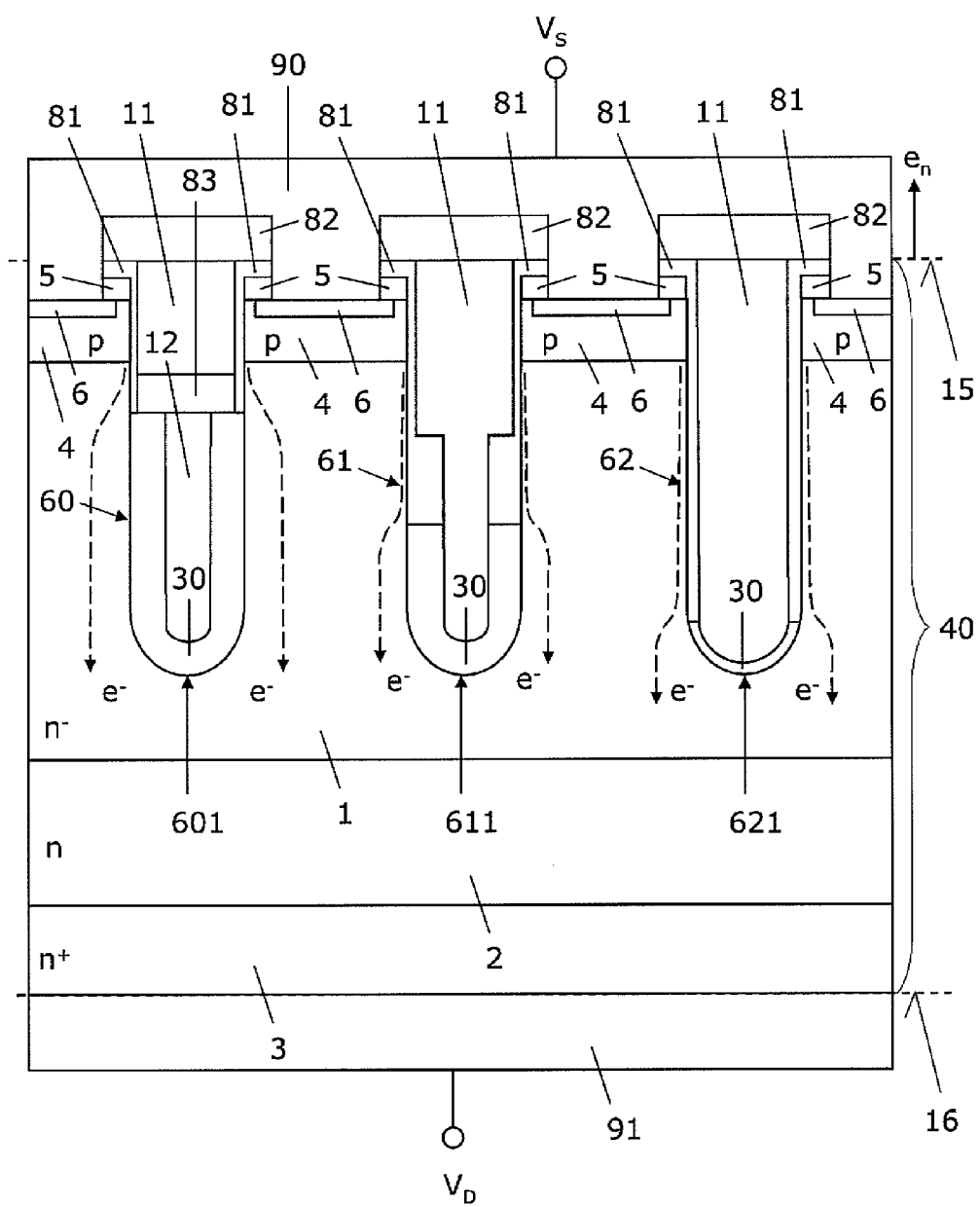
FIG. 1 schematically illustrates a vertical cross-section of a vertical semiconductor device according to one or more embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is arranged substantially perpendicular to the first surface, i.e. parallel to the normal direction of the first surface of the semiconductor substrate or body.

In this specification, n-doped is referred to as first conductivity type while p-doped is referred to as second conductivity type. The majority charge carriers of an n-doped region and a p-doped region are electrons and holes, respectively. In this specification, negative charge type is referred to as first charge type while positive charge type is referred to as second charge type. It goes without saying that the semiconductor devices can be formed with opposite doping relations so that the first conductivity type can be p-doped and the second conductivity type can be n-doped. Accordingly, the first charge type can also refer to the charge type of holes. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$ regions can have different absolute doping concentrations. The same applies, for example, to an $n^+$ and a $p^+$ region.

Specific embodiments described in this specification pertain to, without being limited thereto, field effect transistors, in particular to power field effect transistors. The term "field-effect" as used in this specification intends to describe the electric field mediated forming of a conductive "channel" of a first conductivity type and/or control of conductivity and/or shape of the channel in a semiconductor region of a second conductivity type, typically a body region of the second conductivity type. Due to the field-effect, a unipolar current path through the channel region between a source region of the first conductivity type in ohmic contact with a source electrode and a drain region of the first conductivity type, which is in ohmic contact with a drain electrode, is formed and/or controlled by the electric field. Without applying an external voltage between the gate electrode and the source electrode, the ohmic current path between the source electrode and the drain electrode through the semiconductor device is broken or at least high ohmic in normally-off field effect devices. In normally-on field effect devices such as HEMTs (High Electron Mobility Transistors) and normally-on JFETs (Junction-FETs), the current path between the source electrode and the drain electrode through the semiconductor device is typically low ohmic without applying an external voltage between the gate electrode and the source electrode.

In the context of the present specification, the term "field-effect structure" intends to describe a structure formed in a semiconductor substrate or semiconductor device having a gate electrode for forming and or shaping a conductive channel in the channel region. The gate electrode is at least insulated from the channel region by a dielectric region or dielectric layer. In the context of the present specification, the term "field plate" intends to describe an electrode which is arranged next to a semiconductor region, typically a drift region, insulated from the semiconductor region, and configured to expand a depleted portion in the semiconductor region by applying an appropriate voltage, typically a positive voltage for an n-type drift region. The terms "depleted" and "completely depleted" intend to describe that a semiconductor region comprises substantially no free charge carriers. Typically, insulated field plates are arranged close to pn-junctions formed e.g. between a drift region and a body region. Accordingly, the blocking voltage of the pn-junction and the semiconductor device, respectively, may be increased. The dielectric layer or region which insulates the field plate from the drift region is in the following also referred to a field dielectric layer or field dielectric region. The gate electrode and the field plate may be on same electrical potential. Furthermore, a portion of the gate electrode may be operated as field electrode. Examples of dielectric materials for forming a dielectric region or dielectric layer between the gate electrode or a field plate and the drift region include, without being limited thereto, $SiO_2$, $Si_3N_4$, $SiO_xN_y$, $Al_2O_3$, $ZrO_2$, $Ta_2O_5$, $TiO_2$ and $HfO_2$. The term "power field effect transistor" as used in this specification intends to describe a field effect transistor on a single chip with high voltage and/or high current switching capabilities. In other words, power field effect transistors are intended for high current, typically in the Ampere range, and/or high voltages, typically above 20 V, more typically about 400 V. The term "power field effect transistor" as used herein shall embrace both unipolar power field effect transistor such as power MOSFETs and bipolar power field effect transistor such as power IGBTs.

FIG. 1 illustrates an embodiment of a semiconductor device 100 in a section of a vertical cross-section. The semiconductor device 100 includes a semiconductor body 40 having a first or main surface 15 and a second surface 16 or back surface 16 arranged opposite to the first surface 15. The normal direction $e_n$ of the first surface 15 is substantially parallel to, i.e. defines, the vertical direction.

In the following, embodiments pertaining to semiconductor devices and manufacturing methods therefor, respectively, are explained mainly with reference to silicon (Si) semiconductor devices. Accordingly, a monocrystalline semiconductor region or layer is typically a monocrystalline Si-region or Si-layer. It should however be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN) and gallium nitride (GaN) or silicon-silicon carbide ($Si_xC_{1-x}$) and SiGe heterojunction semiconductor material. For power semiconductor applications currently mainly Si, SiC and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

The semiconductor body 40 is typically a wafer 40 or a die 40. Typically, semiconductor body 40 includes an n-type first semiconductor region 1, an n-type fifth semiconductor region 5, and a p-type fourth semiconductor region 4 which is arranged between the fifth semiconductor region 5 and the first semiconductor region 1. The majority charge carriers of the n-type first semiconductor region 1 are negatively charged electrons. The majority charge carriers of the p-type fourth semiconductor region 4 are positively charged holes. Between the fourth semiconductor region 4 and the fifth semiconductor region 5 and between the fourth semiconductor region 4 and the first semiconductor region 1 respective pn-junctions are formed.

In the exemplary embodiment of FIG. 1, three vertical trenches 60, 61 and 62 extend from the main surface 15, through the fifth semiconductor region 5, the fourth semiconductor region 4 and partially into the first semiconductor region 1. Typically, the first semiconductor region 1, the fourth semiconductor region 4 and the fifth semiconductor region 5 form a drift region 1, a body region 4 and a source region 5, respectively. Each of the trenches 60 to 62 includes a respective electrode structure including a gate electrode 11 which is insulated from the semiconductor body 40 by a respective dielectric region.

Each dielectric region typically includes a dielectric plug 82, which insulates the gate electrode 11 from a source metallization 90, and a gate dielectric layer 81 which is arranged next to the body region 4. The drift region 1 is in ohmic contact with a drain electrode 91 on the back side 16 via an optional field stop layer 2 and an $n^+$-type drift contact layer 3. In the context of the present specification, the terms "in ohmic contact", "in electric contact", "in contact", and "electrically connected" intend to describe that there is an ohmic electric connection or ohmic current path between two regions, portion or parts of a semiconductor devices, in particular a connection of low ohmic resistance, even if no voltages are applied to the semiconductor device. Typically, body region 4 is electrically connected to source electrode 90 via a $p^+$-type body contact region 6. The doping concentrations of source region 5 and body contact region 6 are typically higher than the doping concentration of drift region 1.

Due to short-circuiting source region 5 and body region 4, semiconductor device 100 blocks current in only one current direction. In forward mode, the voltage difference $V_{DS}$ between drain electrode 91 and source electrode 90 is positive. Further, a not shown n-type channel region may be formed in body region 4 by positively biasing the gate electrodes 11 relative to the body region 4. Accordingly, semiconductor device 100 may be operated as a field effect semiconductor device.

Different thereto, the voltage difference $V_{DS}$ is negative in backward mode. In the following, operating a semiconductor device in backward mode is also referred to as reversely biasing the semiconductor device. In backward mode, the pn-junction formed between drift region 1 and body region 4, which is also referred to as body diode, is switched in forward current direction and may carry a backward current. Accordingly, semiconductor device 100 may be operated as a MOSFET with an integrated freewheeling diode. This may e.g. be used for switching inductive loads such as an electrical motor. At high positive voltage difference $V_{DS}$, hot electrons $e^-$ may be generated in drift region 1 in an avalanche mode of semiconductor device 100. The avalanche mode may be desired but may result in device degradation over time. In backward mode, the voltage difference $V_{DS}$ is negative and the body diode is forwardly biased. Accordingly, the voltage drop across the semiconductor device ranges from the threshold voltage (0.7 V for silicon) at low current densities up to several volts at high current densities. In this case, electrons and holes are injected from the drain contact region 3 and the body region 4, respectively, into the drift region 1. Accordingly, the electron density and hole density are substantially equal in drift region 1 and typically much higher than the doping concentration. This means that drift region 1 is flooded with charge carriers. When the semiconductor device 100 is commutated, i.e. switched back to forward mode in which the body diode is reversely biased, the accumulated charge carriers in drift region 1 are drained off prior to and during forming a space charge region at the pn-junction of the body diode. Due to the lower doping of drift region 1 compared to body region 4, main part of blocking voltage typically drops across drift region 1. The electrical field strength in the space charge region mainly depends on the charge distribution. During commutation, not only the positive dopant ions but also the positive charge of the holes, which flow through the space charge region toward body region 4, contribute to the field strength distribution in drift region 1. Accordingly, the gradient of electric field strength is higher with flowing holes. Consequently, avalanche multiplication of electrons may occur at lower voltages compared to static avalanche conditions in forward mode. Thus, hot electrons may be generated by avalanche multiplication during forward mode at high voltages and/or during commutating into forward mode. The term "avalanche mode" as used in this specification shall embrace both static avalanche conditions during forward mode of a semiconductor device and dynamic avalanche conditions during commutating a semiconductor device into forward mode.

According to an embodiment, the electrode structures of the trenches 60, 61, 62 are insulated from drift region 4 in respective lower trench portions 601, 611, 621 by respective negatively charged dielectric portions 30. Accordingly, hot electrons e⁻ which may be generated during forward mode of semiconductor device 100 and/or during commutating semiconductor device 100 into forward mode are repelled from the negatively charged dielectric portions 30. Hot electrons which are generated in a similar device but without negatively charged dielectric portions may result in device degradation. In particular hot electrons which are generated close to an interface between the drift region and the insulation of the trenches may enter the insulation with high enough energy to cause damages of the insulation. This process is avoided or at least reduced by the negatively charged dielectric portions 30 of semiconductor device 100.

The term "hot charge carrier" as used in this specification intends to describe a charge carrier which is not in thermal equilibrium with the lattice. The term "hot charge carrier" as used in this specification embraces a charge carrier with high enough energy to enter the conduction band of the dielectric region. Within this specification, protecting semiconductor devices against hot charge carrier degradation is mainly explained with respect to hot electrons forming the majority charge carriers of an n-doped semiconductor region. It goes without saying, that the hot charge carriers may also be hot holes in a p-doped semiconductor region. Hot charge carriers are typically formed in high electric field regions of the semiconductor device but may also be thermally generated. The negatively charged dielectric portions 30 include fixed charges of the same charge type as the majority charge carriers of drift region 1, i.e. fixed negative charges for the shown n-doped drift region 1 in FIG. 1. In case of an adjoining p-doped semiconductor region, fixed positive charges are embedded in the charged dielectric portions 30. Accordingly, the charged dielectric portion 30 forms a Coulomb screen against hot majority charge carriers of the adjoining drift region 1. As illustrated by the dashed arrows in FIG. 1, hot electrons e⁻ are prevented by the Coulomb screen from reaching charged dielectric portion 30 and guided within drift region 1 toward drain electrode 91. Typically, hot electrons e⁻ are at least deflected from the semiconductor-insulator interfaces formed in the lower portion 601, 611, 621 of the respective trenches 60, 61, 62. This means, that hot electrons e⁻ are, in avalanche mode, at least deflected from regions of highest electric field strength which are close the semiconductor-insulator interface. Accordingly, dielectric portions 30 and typically also dielectric portion 81 are protected again entrapment of hot electrons. Thus, a change of properties of the dielectric layer is typically avoided. Accordingly, the switching behavior and/or the transistor characteristics of semiconductor device 100 are typically not or almost not affected by hot carrier injection. This in turn avoids e.g., the destruction of other parts of the circuit or any EMC-problems (Electro-Magnetic Compatibility) which may arise in semiconductor devices without charged dielectric portion 30 over time. Furthermore, injection of hot electrons into dielectric regions may cause formation of trapped positive charges. Entrapment of positive charges may cause a self-amplified change of transistor characteristics and/or switching behavior. In this case, hot electrons which are created in a subsequent process are attracted by the entrapped positive charges. Due to the negatively charged dielectric portion 30, a self-amplified change of the switching behavior, which may even cause device destruction, is typically avoided. Thus, semiconductor device 100 is protected against hot carrier induced degradation.

In the illustration of FIG. 1, three possible variants of different trench structures 60, 61, 62 with respective charged dielectric portions 30 are shown. Each variant may be used for a given embodiment. Each of the three trench structures 60 to 62 may form a unit cell in an active area of a power semiconductor device. Typically, a plurality of equal unit cells are arranged in the active area of the power semiconductor device 100. In other words, semiconductor device 100 includes a semiconductor body 40 with an n-type source region 5, an n-type drift region 1, a p-type body region 4, which is arranged between source region 5 and drift region 1, and at least one trench 60, 61, 62. The at least one trench 60, 61, 62 extends from source region 5, through body region 4 and into drift region 1 and includes an electrode structure which is insulated against semiconductor body 40 by a dielectric region. The dielectric region includes a negatively charged dielectric portion 30. It goes without saying, that the doping relations and the charge type of the charged dielectric portion may also be reversed.

In the lower portion 601 of trench 60 a field plate 12 is arranged which is insulated by a further dielectric plug 83 and the negatively charged region 30 against gate electrode 11 and drift region 1, respectively. In the lower portions 611 and 621 of trenches 61 and 62, respectively, a lower part of the respective gate electrode 11 below body region 4 may be operated as field plate. Accordingly, the negatively charged region 30 and the lower part of the gate oxide 81 typically form a field dielectric region. Typically, the negatively charged dielectric portion 30 is arranged in a portion of the field dielectric region which is next to a region of highest electron current in an avalanche mode to protect at least the parts of the field dielectric region which are at highest risk of hot charge carrier injection. The field plate 12 and the lower parts of the gate electrodes 11 may further be used as compensation structures. Accordingly, the drift region 1 may be higher doped than the optional layer 2. For example, the drift region may be n-doped and the optional layer 2 may be n⁻-doped. In this case, a further n-doped semiconductor layer having a higher doping concentration than the drift region 1 may be arranged between the optional layer 2 and the drift contact layer 3.

Semiconductor device 100 may also be described as a semiconductor device 100 having a semiconductor body 40 with a first semiconductor region 1 of a first conductivity type and a dielectric region having a charged dielectric portion 30 with fixed charges and a dielectric portion 81. The charge type of the fixed charges is equal to the charge type of the majority charge carriers of the first semiconductor region 1. Dielectric portion 81 may be uncharged or may also comprise fixed charges with a first maximum charge carrier density per area. The charged dielectric portion 30 has a second maximum charge carrier density per area which is larger than the first maximum charge carrier density per area. Typically, the second maximum charge carrier density per area is larger than about 10 times the first maximum charge carrier density per area. In the following, dielectric portion 81 and charged dielectric portion 30 are also referred to as a first charged dielectric portion 81 and a second charged dielectric portion 30, respectively.

According to an embodiment, the dielectric region forms a dielectric-semiconductor-interface with the first semiconductor region 1. Typically, the dielectric region is arranged between the first semiconductor region 1 and a gate electrode 11 and/or between the first semiconductor region 1 and a field plate 12 and/or along a drift region 1 formed by the first semiconductor region 1. As illustrated in trenches 61 and 62, charged dielectric portion 30 may be arranged between gate electrode 11 and drift region 1. However, the charged dielectric portion 30 is typically not arranged between gate electrode 11 and a body region 4. This means, that the charged dielectric portion 30 is typically not part of a gate dielectric layer next to a channel region in body region 4. This is to avoid changing the threshold voltage of gate electrode 11. In other words, a gate electrode 11 which extends into the drift region 1 is typically insulated from drift region 1 by a charged dielectric portion 30 in a lower part below body region 4 where the gate electrode 11 may be operated as field plate. Accordingly, the charged dielectric portion, which is in the following also referred to as charged dielectric region 30 and charged dielectric layer 30, is typically arranged along drift region 1 of semiconductor device 100 and forms a dielectric-semiconductor interface with drift region 1. Typically, charged dielectric layer 30 is arranged close to regions of highest electric field in forward mode of semiconductor device 100.

According to embodiments, the n-type drain contact region 3 is replaced by a p⁺-type collector region for forming an IGBT or an horizontally alternating arrangement of n-type and p-type regions for forming an IGBT with integrated freewheeling diode. Accordingly, the electrodes 90 and 91 form an emitter electrode 90 and collector electrode 91, respectively. Due to the charged dielectric layers 30, hot electrons generated in an avalanche mode of the IGBT are at least deflected from the lower trench portions. Thus, the IGBT is protected against hot charge carrier induced degradation.

Figure 2:
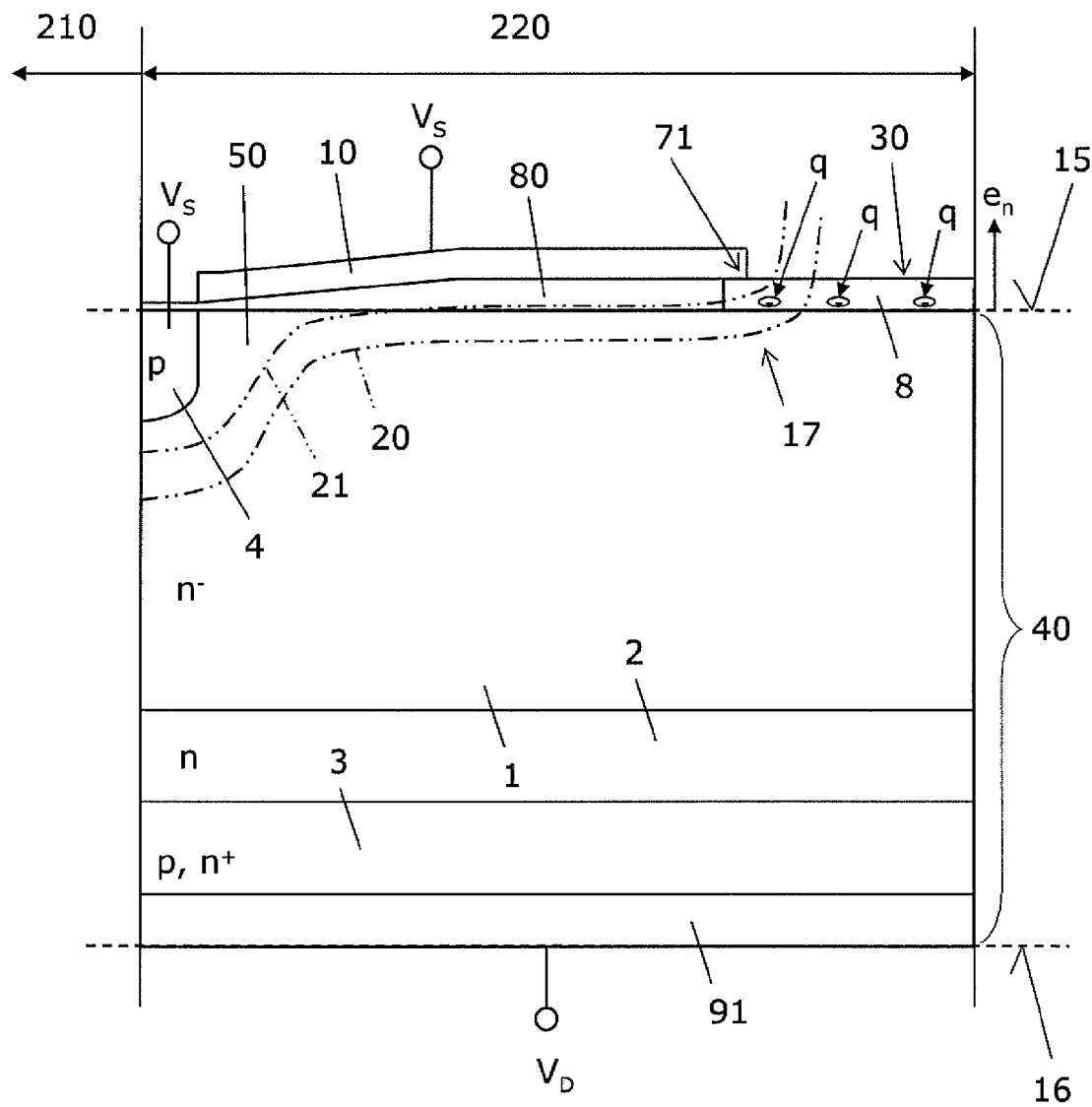
FIG. 2 schematically illustrates a vertical cross-section of a vertical semiconductor device according to one or more embodiments.

FIG. 2 illustrates an embodiment of a vertical power semiconductor device 200 in a section of a vertical cross-section. In the section of FIG. 2 only a peripheral area 220 with an exemplary edge termination is illustrated in detail. The adjoining active area 210 of semiconductor body 40 typically includes a plurality of transistor structures, for example a plurality of field effect transistor cells as explained with reference to FIG. 1. Typically, a first n-type semiconductor region 1, which typically forms a drift region 1 in the active area 210, reaches main surface 15 in the peripheral area 220. To ensure high blocking voltage an edge termination with an insulated field plate 10 is arranged on main surface 15. Field plate 10 is insulated against semiconductor body 40 by a field insulating region. Field plate 10 may be electrically floating or may be connected to a voltage. In the exemplary embodiment of FIG. 2, field plate 10 is connected to the voltage of p-type fourth semiconductor region 4.

According to an embodiment, the field insulating region includes a first dielectric portion 80 and a negatively charged dielectric portion 30. The first dielectric portion 80 may be slightly positively charged, more typically uncharged or charged with negative charge carriers up to a first maximum charge carrier density per area. The negatively charged dielectric portion 30 is arranged next to an edge 71 of the field plate 10 and charged with negative charge carriers up to a maximum charge carrier density per area which is larger than the first maximum charge carrier density per area. FIG. 2 illustrates semiconductor device 200 during blocking mode in which the first semiconductor region is partly or completely depleted. During blocking mode, the voltage difference between the voltage $V_S$ between fourth semiconductor region 4 and the voltage $V_D$ of drain electrode 91 is negative, i.e. $V_S<V_D$. Field plate 10 is typically connected with a p-type fourth semiconductor region 4 which may form a body region 4 in the active area 210 of a MOSFET or an IGBT. Alternatively, p-type fourth semiconductor region 4 may form an anode of a diode. Field plate 10 provides an equipotential surface. Close to field plate 21 exemplary equipotential lines 20, 21 are substantially parallel to field plate 10. Thus, equipotential line 20 in FIG. 2 crosses main surface 15 of semiconductor body 40 close to edge 71. Due to the negatively charged dielectric portion 30 the equipotential line are redistributed in blocking mode of semiconductor device 200 such that a region 17 of highest electric field in semiconductor region 1 next to edge 71 of field plate 10 is avoided. Accordingly, the risk of generation of hot electrons is reduced. Further, hot electrons are deflected by the Coulomb screen of the negatively charged dielectric portion 30. Accordingly, the field insulating region is protected against hot charge carrier induced degradation. It goes again without saying that charged dielectric portion 30 may also be positively charged when the doping types of the semiconductor regions of semiconductor device 200 are reversed.

Typically, the carrier density per area of the charged portion 30 decreases step-wise or continuously toward the outer border of the edge termination structure. Accordingly, the maximum field strength in semiconductor region 1 during blocking mode may further be reduced. In FIG. 2 the charges in charged dielectric portion 30 are depicted as condensed charges q. Typically, charge is substantially continuously distributed in a horizontal plane in charged dielectric portion 30 of FIG. 2.

The first dielectric portion 80 may also be negatively charged to be better shielded against entrapment of thermally generated hot majority charge carriers when the semiconductor device is in blocking mode.

In other embodiments, only one uniformly charged field insulating region 30 is used to insulate field plate 10 and the first semiconductor region 1.

Figure 3:
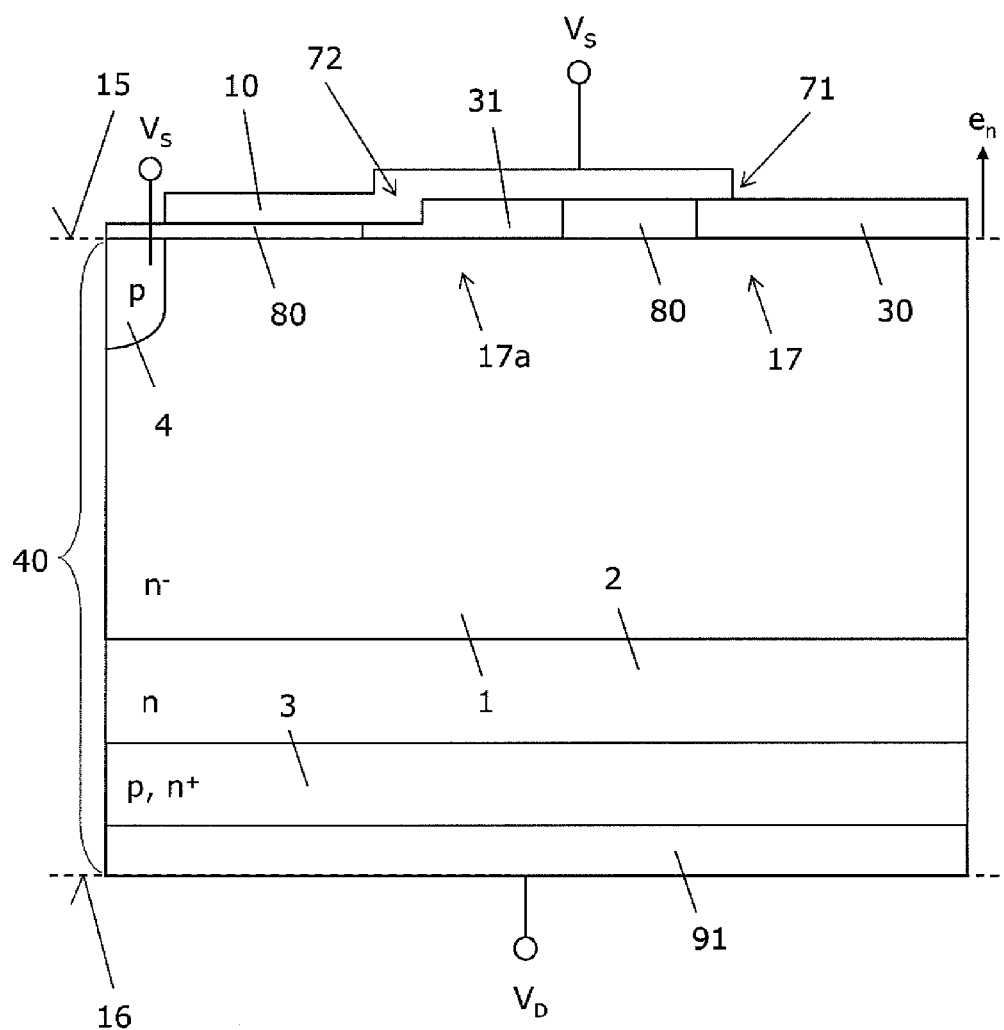
FIG. 3 schematically illustrates vertical cross-sections of a semiconductor devices according to one or more embodiments.

FIG. 3 illustrates an embodiment of a vertical power semiconductor device 201 in a section of a vertical cross-section. Power semiconductor device 210 is similar to power semiconductor device 200 of FIG. 2. However, the section of FIG. 3 only illustrates the peripheral area 221. Further, the edge termination structure of FIG. 3 includes a field plate 10 with an additional step 72. According to an embodiment, a further negatively charged dielectric portion 31 of increased charge carrier density per area is additionally arranged next to step 72. Accordingly, an electric field maximum 17a in semiconductor region 1 and close to step 72 may be reduced or even avoided. In the embodiment of FIG. 3, the negative charge carrier density per area of the field insulating region formed by the portions 30, 31, and the two lower or not charged portions 80 changes step-wise in horizontal direction. In other embodiments, the carrier density per area of the charged portions changes smoothly. For example, the carrier density per area may continuously decrease with horizontal distance to the edge 71 and/or step 72 of field electrode 10.

Figure 4:
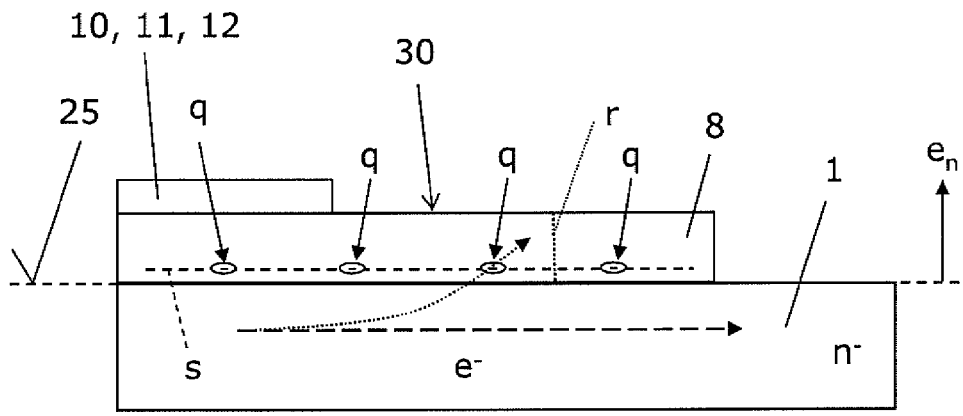
FIG. 4 schematically illustrates a vertical cross-section of a vertical semiconductor device according to one or more embodiments.
Figure 4:
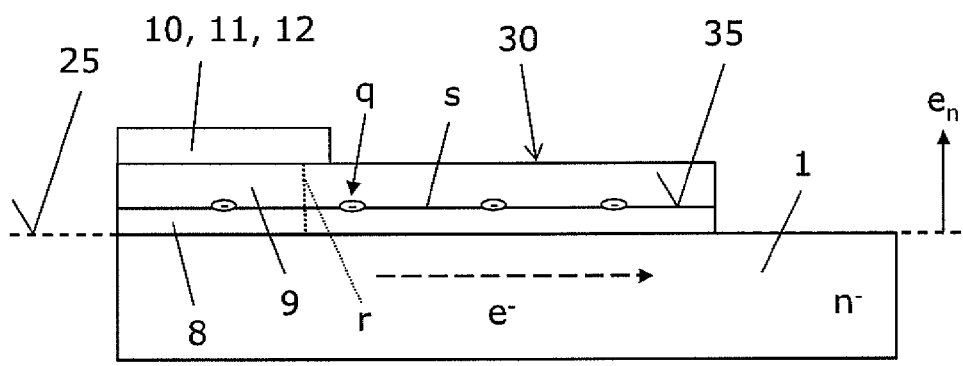
Figure 4:
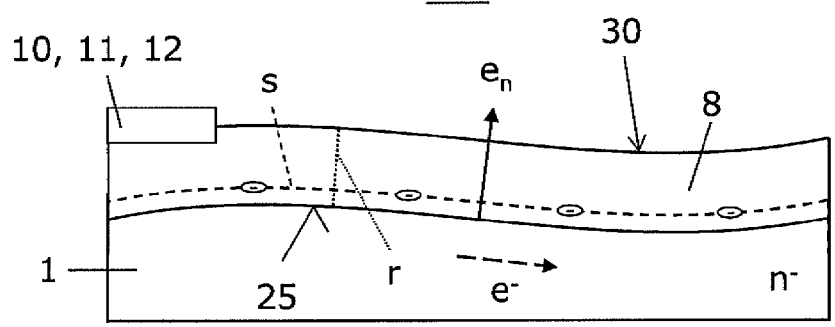

With respect to FIG. 4 further embodiments will be explained. FIG. 4 illustrates three semiconductor devices 101, 102 and 103 in a section of a vertical cross-section. The semiconductor devices 101 to 103 may correspond to sections of the semiconductor devices 100, 200 and 201 explained with respect to FIGS. 1 to 3. This means, that the structures 101 to 103 may be part of field plate structure or an edge termination structure. They may however also be arranged along a drift region 1 but further away from electrodes which may be operated as field plates. This will explained in more detail below with reference to FIGS. 6 to 9. Accordingly the shown electrodes 10 to 20 in FIG. 4 are only optional.

The semiconductor devices 101, 102, 103 have a first semiconductor region 1 and a charged dielectric layer 30 which is arranged next to the first semiconductor region 1 and includes fixed charges q. Typically, the charged dielectric layer 30 forms an interface 25 with the first semiconductor region 1. The interface 25 may be a main surface of a semiconductor body, an interface in a trench extending into the first semiconductor region, or an interface of a buried oxide layer. The charge type of the fixed charges q is equal to the charge type of the majority charge carriers of the first semiconductor region 1. In the embodiments of FIG. 4, the charged dielectric layer 30 is negatively charged. The charge carrier density per area of the charged dielectric layer 30 is chosen such that the charged dielectric layer 30 is shielded against entrapment of hot majority charge carriers generated in the first semiconductor region 1. In other words, an appropriately charged dielectric layer 30 is used to protect the semiconductor device 101 to 103 against hot charge carrier induced degradation. This is illustrated for the semiconductor device 101 by the dashed arrow. Due to the Coulomb shield formed by the fixed charges q in the charged dielectric layer 30, injection of hot electrons e⁻ into the charged dielectric layer 30 is prevented or at least reduced. The hot electrons e⁻ are typically guided in semiconductor region 1 at safe distance from the charged dielectric layer 30 until they thermalize, recombine at a pn-junction, are discharged at an electrode, or injected into an uncritical dielectric region in which fixed charges do not or do almost not influence the characteristics of the semiconductor device. Accordingly, the degradation of charged dielectric layer 30 is prevented or at least reduced.

The charged dielectric layer 30 of semiconductor device 101 is formed by a dielectric layer 8 which includes fixed charges q. For clarity reasons, only a few negative charges q are shown in dielectric layer 8. Dielectric layer 8 has a carrier density per area of fixed charges q which may be defined as the integrated carrier density of fixed charges per volume along a line r through dielectric layer 8. Charge density per volume can vary on the way normal to the interface 25 or may be homogeneously distributed, depending on the process used to generate charge in layer 30. Typically, line r is normal to the interface 25 between charged dielectric layer 8 and first semiconductor region 1. The carrier density per area of fixed charges q may be constant, at least in sections, or vary along a path s which is substantially parallel to the interface 25.

According to an embodiment, the charged dielectric layer 8 is formed as a doped dielectric region having fixed charges. The charged dielectric layer 8 may e.g. be formed of silicon dioxide doped with aluminum, nitrogen or cesium. Aluminum-doped and nitrogen-doped silicon dioxide is typically negatively charged, whereas cesium doped silicon dioxide is typically positively charged.

The carrier density per area of fixed charges q depends on dopant concentration. Typically, the absolute value of the carrier density per area is larger than about $10^{11}/cm^2$, more typically larger than about $10^{12}/cm^2$. Higher absolute values of the carrier density per area ensure a better shielding against hot charge carriers. The upper limit of the carrier density per area is typically given by the charge density per area causing avalanche multiplication in the adjoining semiconductor material of semiconductor region 1. The upper limit of the carrier density per area is about $2 \ldots 4*10^{12}/cm^2$ for silicon depending on the level of doping. For SiC and GaN the upper limit of the carrier density per area is about $2*10^{13}/cm^2$.

The charged dielectric layer 30 of semiconductor device 102 has similar properties with respect to fixed charge carrier density per area as the charged dielectric layer 30 of semiconductor device 101. However, the charged dielectric layer 30 of semiconductor device 102 is formed as a stack of different dielectric layers 8, 9 with fixed charges q arranged therebetween as surface charges q. A first dielectric layer 8, e.g. a layer of $SiO_2$, is arranged on the first semiconductor region 1 and second gate dielectric layer 9, e.g. a $Si_3N_4$ layer, is arranged on the first gate dielectric layer 8. The charged layer 30 includes an interface 35 formed between the first and second gate dielectric layer 8, 9. $Si_3N_4$ has a lower band gap than $SiO_2$. Accordingly, negative charges q are usually trapped in $Si_3N_4$ at or close to the interface with $SiO_2$. The charged dielectric layer 30 of semiconductor device 102 may also include a layer of higher dielectric constant such as aluminum oxide, hafnium dioxide, hafnium silicate, or zirconium dioxide. These materials may be deposited using chemical vapor deposition (CVD) or atomic layer deposition (ALD) and allow dielectric constants of more than about 7 and even more than about 20.

The charged dielectric layer 30 of semiconductor device 103 has similar properties with respect to fixed charge carrier density per area as the charged dielectric layer 30 of semiconductor device 101 and semiconductor device 102, respectively. It may either be formed of a doped layer 8 or a stack of layers. As the interface 25 between semiconductor region 1 and the charged doped layer 8 is curved, the charge carrier density per area of fixed charges is typically determined for a curved path s which is substantially parallel to the interface 25. The carrier density per area of fixed charges q is typically also defined as the integrated carrier density of fixed charges per volume along a line r through dielectric layer 8, wherein r is substantially normal to the interface 25 between charged dielectric layer 8 and first semiconductor region 1. Accordingly, the carrier density per area of the fixed charges may changes step-wise or continuously along the curved path s in the charged dielectric layer, with the curved path s being substantially parallel to the interface 25.

Typically, the charged dielectric layer 30 is arranged between a field plate 10, 12 and drift region 1, or between drift region 1 and a portion of a gate electrode 11 which may be operated as a field plate and/or along the drift region at a main surface of a semiconductor device.

Figure 5:
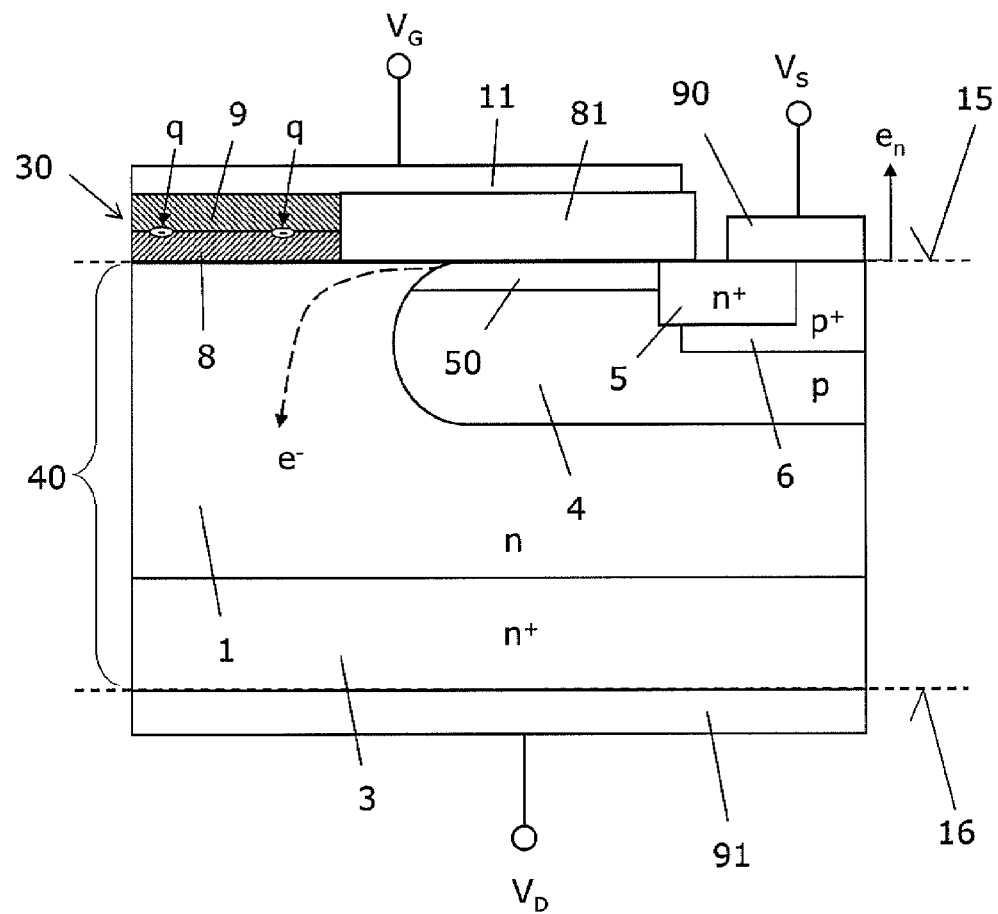
FIG. 5 schematically illustrates a vertical cross-section of a vertical semiconductor device according to one or more embodiments.

FIG. 5 illustrates an embodiment of a vertical power semiconductor device 250 in a section of a vertical cross-section.

The power semiconductor device 250 is also a vertical n-channel power semiconductor device, typically DMOS-FET (double-diffused metal-oxide semiconductor field effect transistor). As such the section of FIG. 5 typically corresponds to a unit cell of an active area of semiconductor device 250. The power semiconductor device 250 includes a semiconductor body 40 between a main surfaces 15 and a back surface 16. An n-type drift region 1 extends to main surface 15 and includes a partially embedded p-type body region 4 or well 4 which also extends to main surface 15 and is contacted via a p$^+$-type body contact region 6 to a source electrode 90 arranged on main surface 15. A gate electrode 11 is arranged on main surface 15 and insulated from semiconductor body 40 by a gate dielectric layer 81 and a charged dielectric layer 30. Gate dielectric layer 81 and charged dielectric layer 30 are arranged side by side in a direction which is parallel to the current flow in channel region 50, i.e. in horizontal direction in the embodiment of FIG. 5. Above a high enough positive threshold voltage between gate electrode 11 and source electrode 90 an n-channel region 50 is formed in body region 4. Accordingly, a current between an n$^+$-type source region 5 connected with source electrode 90 and a drain electrode 91 on back surface 16 may flow in a forward current mode. Drain electrode 91 is typically in ohmic contact with drift region 1 via an n$^+$-type drain contact region 3.

Typically, gate dielectric layer 81 adjoins channel region 50 and has a lower maximum charge carrier density per area than the negatively charged dielectric layer 30 which is typically spaced apart from channel region 50. Typically, the maximum charge carrier density per area of gate dielectric layer 81 is below $10^{11}/cm^2$, more typically below $10^{10}/cm^2$. Further, charged dielectric layer 30 is spaced apart in horizontal direction from body region 4. Accordingly, a low threshold voltage $V_{th}=V_G-V_s$ for forming the n-type channel 50 in channel region 5 is ensured.

Different thereto, the maximum charge carrier density per area of the negatively charged dielectric layer 30 is typically larger than $10^{11}/cm^2$, more typically larger than $10^{12}/cm^2$ to ensure a sufficiently strong Coulomb screen for hot majority charge carriers which may be generated in drift region 1 in forward mode.

According to an embodiment, the semiconductor devices as described herein are an n-channel field-effect semiconductor device which includes a semiconductor body 40 with an active area. The active are includes an n-type semiconductor region 1 and a negatively charged dielectric region 30 which is arranged next to the n-type semiconductor region 1. The negatively charged region 30 has fixed negative charges with a maximum carrier density per area which is larger than about $10^{11}/cm^2$, more typically larger than about $10^{12}/cm^2$. This applies not only to vertical but also to lateral semiconductor devices as illustrated with respect to the following FIGS. 6 to 9.

Figure 6:
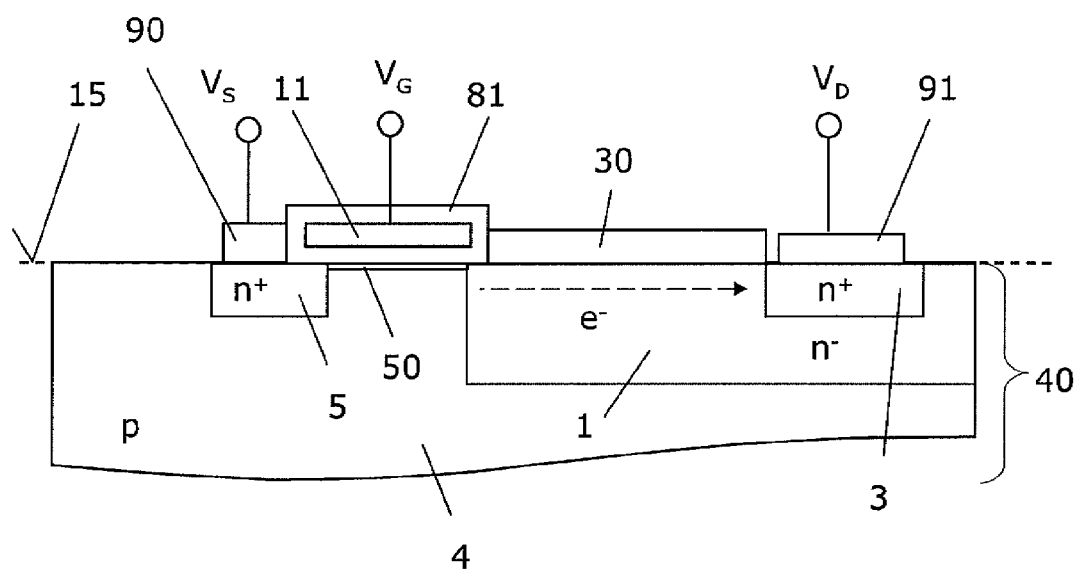
FIG. 6 schematically illustrates vertical cross-section of a lateral semiconductor device according to one or more embodiments.

FIG. 6 illustrates an embodiment of a lateral MOSFET 300 in a section of a vertical cross-section. Lateral MOSFET 300 includes a gate electrode 11, a source electrode 90 and a drain electrode 91 which are arranged on a main surface 15 of a semiconductor body 40. MOSFET 300 is typically also a power semiconductor device. In the embodiment of FIG. 6, an n-type drift region 1 is partially embedded in a p-type body region 4 which extends between the main surface 15 and a back surface 16. Body region 4 is contacted with source electrode 90 by a p$^+$-type body contact region 6. Drift region 1 is contacted via an n$^+$-type drain contact region 3 with drain electrode 91 and via an n$^+$-type source region 5 with source electrode 90. Drift region 1 extends to main surface 15.

According to an embodiment, a negatively charged dielectric layer 30 is arranged on drift region 1. Accordingly, a gate oxide layer 81 which insulates gate electrode 11 from semiconductor body 40 is protected against hot electron injection in a forward mode of semiconductor device 300. This is illustrated by the dashed arrow. In avalanche condition, carrier multiplication will not commence close to the main surface 15 but buried in the crystal e.g., at the level of the electron path shown in FIG. 6. In other words, a negatively charged dielectric layer 30 is arranged along at least a part of the drift region 1 to avoid or at least reduce hot carrier induced device degradation. Charged dielectric layer 30 reduces the effective conductance in drift region 1 at the surface leading to higher and undesired on-state resistance of the device. This may be easily overcome by slightly increasing the doping of drift region 1.

Figure 7:
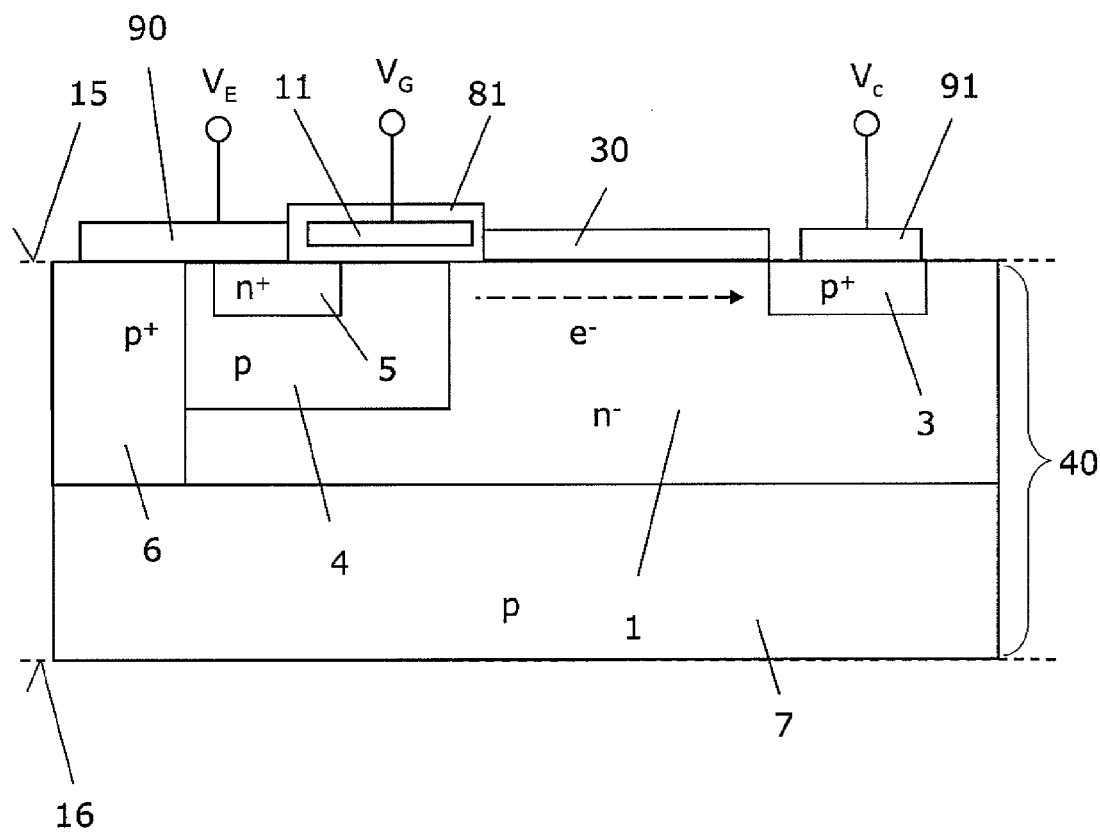
FIG. 7 schematically illustrates a vertical cross-section of a lateral semiconductor device according to one or more embodiments.

FIG. 7 illustrates an embodiment of a lateral IGBT 400 in a section of a vertical cross-section. The lateral IGBT 400 is similar to the lateral MOSFET 300 of FIG. 6. However, instead of the n$^+$-type drain contact region, a p$^+$-type collector region 3 is connected with electrode 91 of semiconductor device 400. In addition, body region 4 and drift region 1 are arranged on a common p-type substrate 7 which is also connected to electrode 90 by the p$^+$-type contact region 6. Further, the electrodes 90 and 91 are typically referred to as emitter electrode 90 and collector electrode 91, respectively. Alternatively, p$^+$-type and n$^+$-type contact regions (not shown) may be connected to the electrode 90 to ensure reverse diode operation.

According to an embodiment, a negatively charged dielectric layer 30 is arranged along at least a part of the drift region 1 to avoid or at least reduce hot carrier induced degradation of gate dielectric layer 81.

Figure 8:
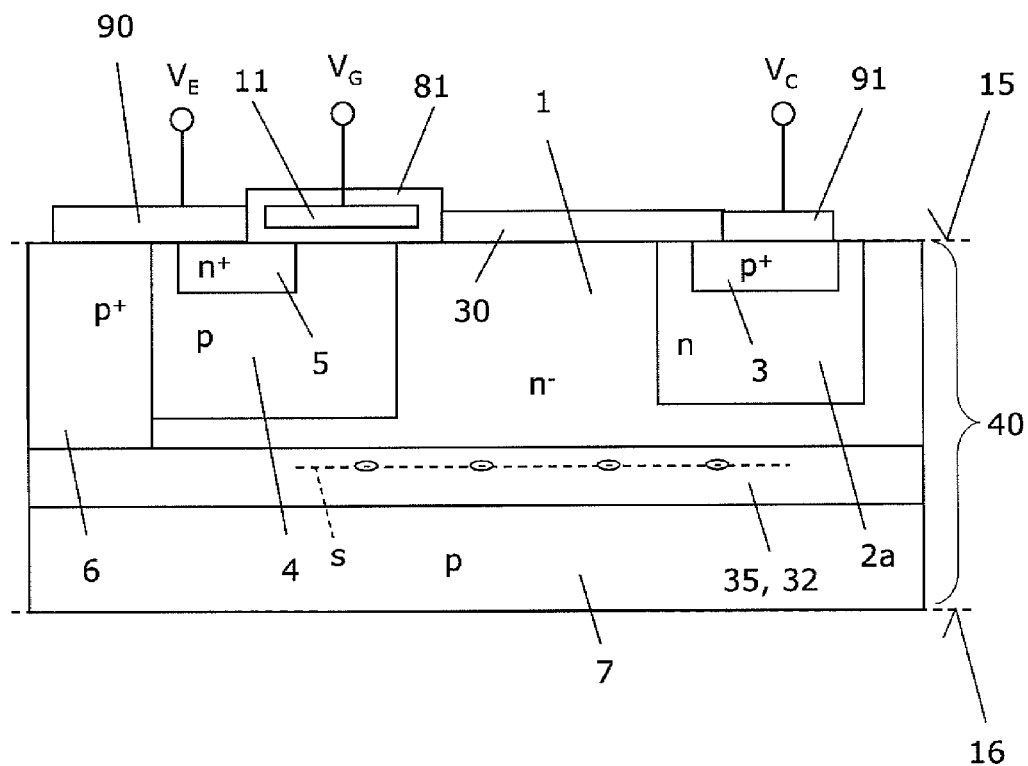
FIG. 8 schematically illustrates a vertical cross-section of a lateral semiconductor device according to one or more embodiments.

FIG. 8 illustrates an embodiment of a lateral IGBT 401 in a section of a vertical cross-section. The lateral IGBT 401 is similar to the lateral IGBT 400 of FIG. 7. However, the semiconductor device 401 is a silicon on insulator ("SOI") device. Accordingly, a buried oxide ("BOX") layer 35 is arranged between the common substrate 7 and the other semiconductor regions of semiconductor body 40. Further an optional n-type well 2a is arranged between collector region 3 and drift region 1.

According to an embodiment, a further negatively charged dielectric region or layer 32 is formed by the buried oxide ("BOX") layer 35 of the silicon on insulator device 401. Due to the Coulomb screen generated by the fixed charges of charged dielectric region layers 30 and 32, hot-electron-induced device degradation may be reduced. The buried oxide layer 35 typically includes fixed negative charges with a carrier density per area of more than about $10^{11}/cm^2$/or even more than $10^{12}/cm^2$.

Figure 9:
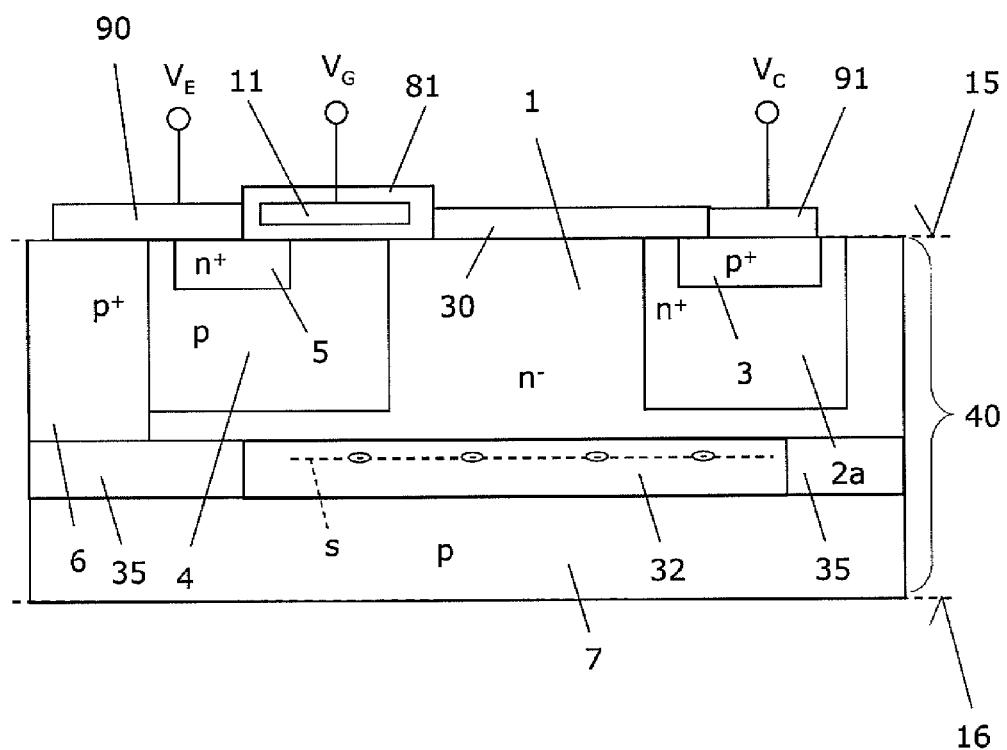
FIG. 9 schematically illustrates a vertical cross-section of a lateral semiconductor device according to one or more embodiments.

FIG. 9 illustrates an embodiment of a lateral IGBT 402 in a section of a vertical cross-section. The lateral IGBT 402 is similar to the lateral IGBT 401 of FIG. 8. However, only a portion 32 of the BOX-layer 35 is negatively charged. Typically, portion 32 extends in horizontal direction at least between body region 4 and the n-type well 2a.

Figure 10:
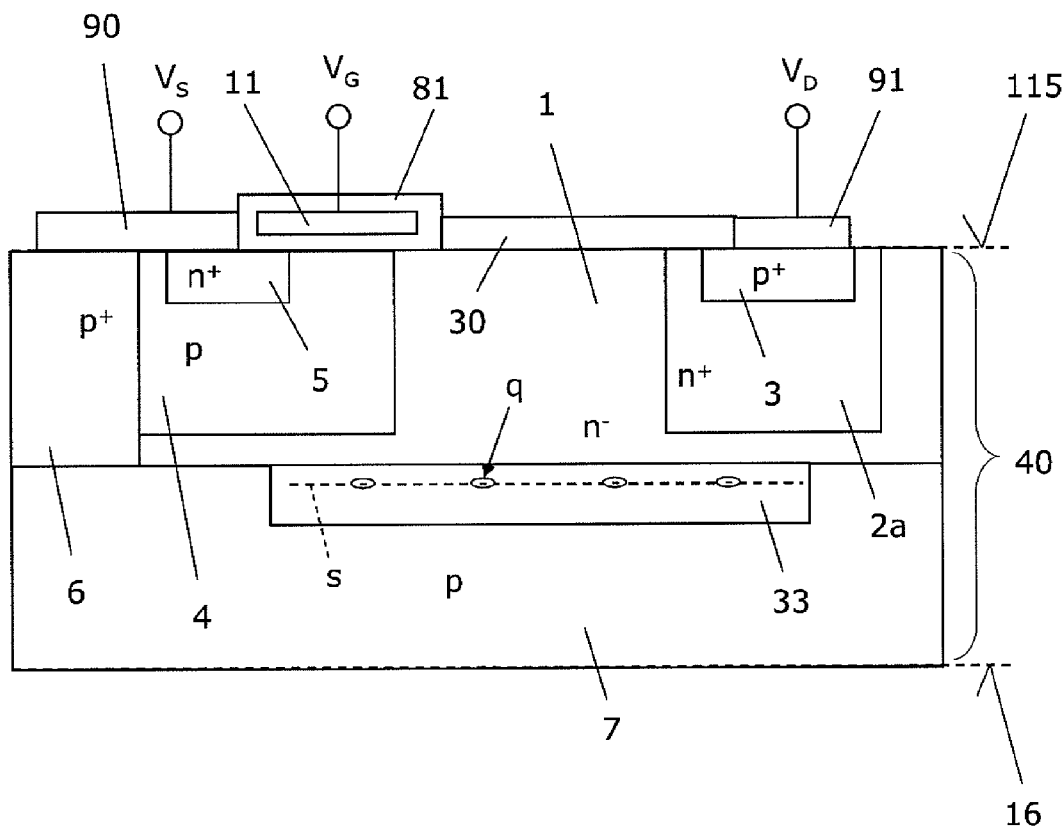
FIG. 10 schematically illustrates a vertical cross-section of a lateral semiconductor device according to one or more embodiments.
Figure 11:
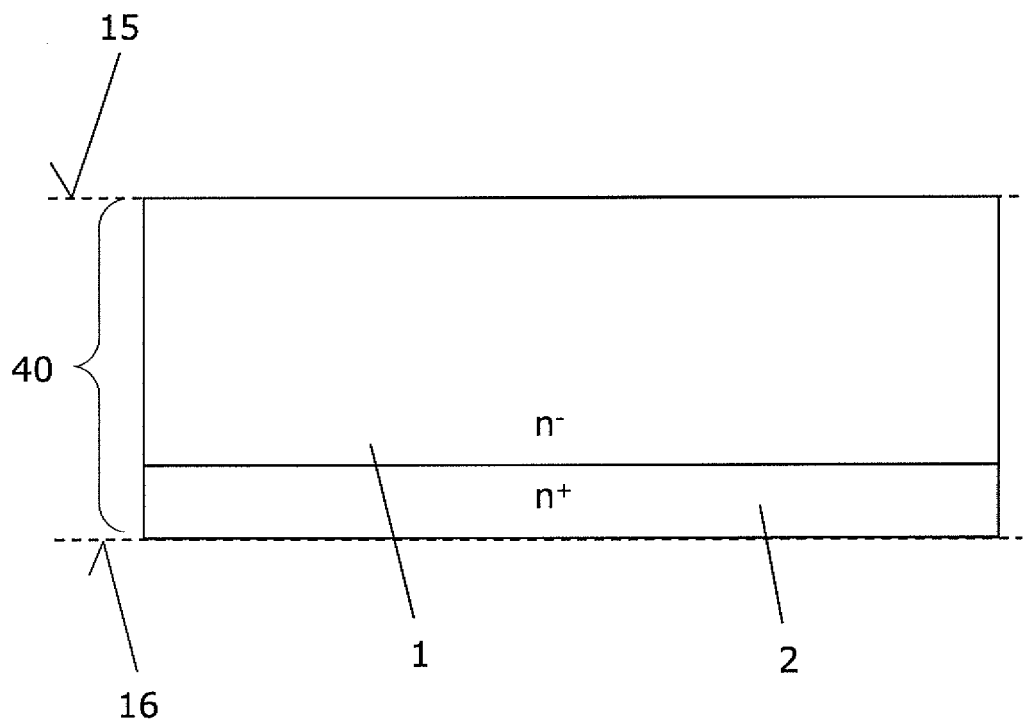
FIGS. 11-19 illustrate manufacturing processes according to one or more embodiments.

FIG. 10 illustrates an embodiment of a lateral IGBT 403 in a section of a vertical cross-section. The lateral IGBT 403 is similar to the lateral IGBT 402 of FIG. 9. However, IGBT 403 is formed on a partial silicon on insulator wafer having a charged partial BOX-layer 33.

It goes with out saying, that the charged dielectric layers of FIGS. 7 to 10 may be combined.

With respect to FIGS. 11 to 19 methods for forming a semiconductor device 207 according to several embodiments are illustrated. Emphasis is placed on the layer generation on the main horizontal surface 15. Without further specification, doping regions in the semiconductor can be manufactured before and/or during and/or after the illustrated formation of charged layer. In a first process, a wafer or substrate 40 comprising a main horizontal surface 15 and a semiconductor layer 1 of a first conductivity type (n-type) is provided. Semiconductor layer 1 extends to main horizontal surface 15. Substrate 40 may be made of any suitable semiconductor material such as Si or GaN or SiC. A heavily doped n$^+$-type contact layer 2 may extend from semiconductor layer 1 to a back surface 16 arranged opposite to the main surface 15 to later form an ohmic connection to a drain metallization. Further, substrate 40 may already include embedded body regions of a second conductivity type (p-type).

Thereafter, a first dielectric layer 8a is formed on the main horizontal surface 15. Dielectric layer 8a typically includes SiO$_2$ and may be formed by deposition and/or thermal oxidation. SiO$_2$ may be deposited in a CVD (Chemical Vapor Deposition) process. Alternatively, silicon may be deposited on the semiconductor body 40 prior to thermally oxidizing. In the case of a Si-semiconductor body 40, layer 8a is typically formed by thermal oxidation, but may also be formed by a CVD process.

Figure 12:
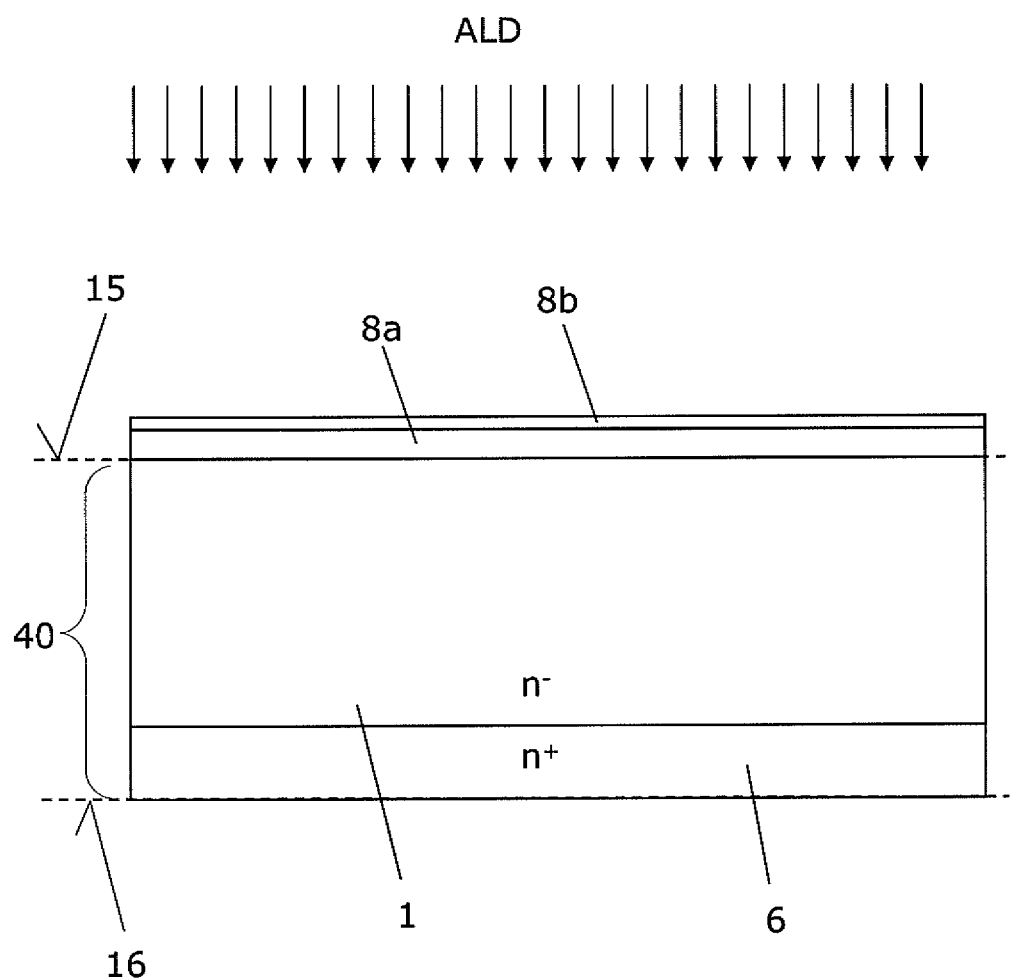

In a subsequent process, a second layer 8b is formed on the first dielectric layer 8a. According to an embodiment, second layer 8b is formed by atomic layer deposition (ALD). The thickness of layer 8b depends on the amount of charges to be trapped. Typically, less than one molecule or atom layer is deposited in one ALD-shot. One up to several ALD-shots are typically used to form a thin layer 8b. The resulting semiconductor structure 207 is shown in FIG. 12.

Figure 13:
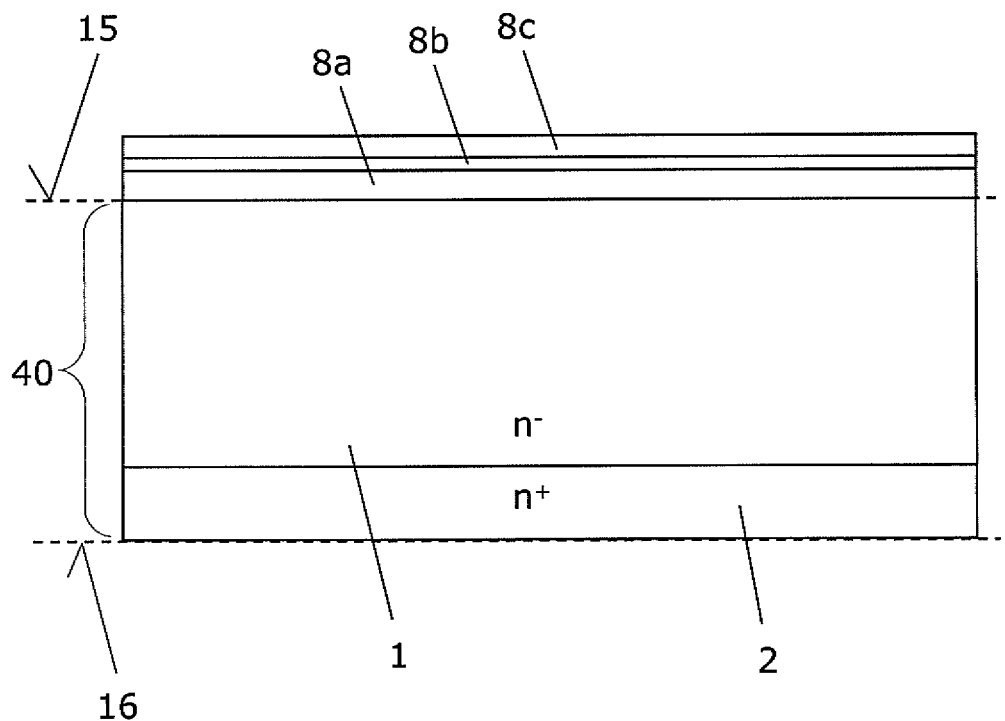

Thereafter, a second dielectric layer 8c, e.g. a SiO$_2$-layer, is formed on the second layer 8b. The resulting semiconductor structure 207 is shown in FIG. 13.

Figure 14:
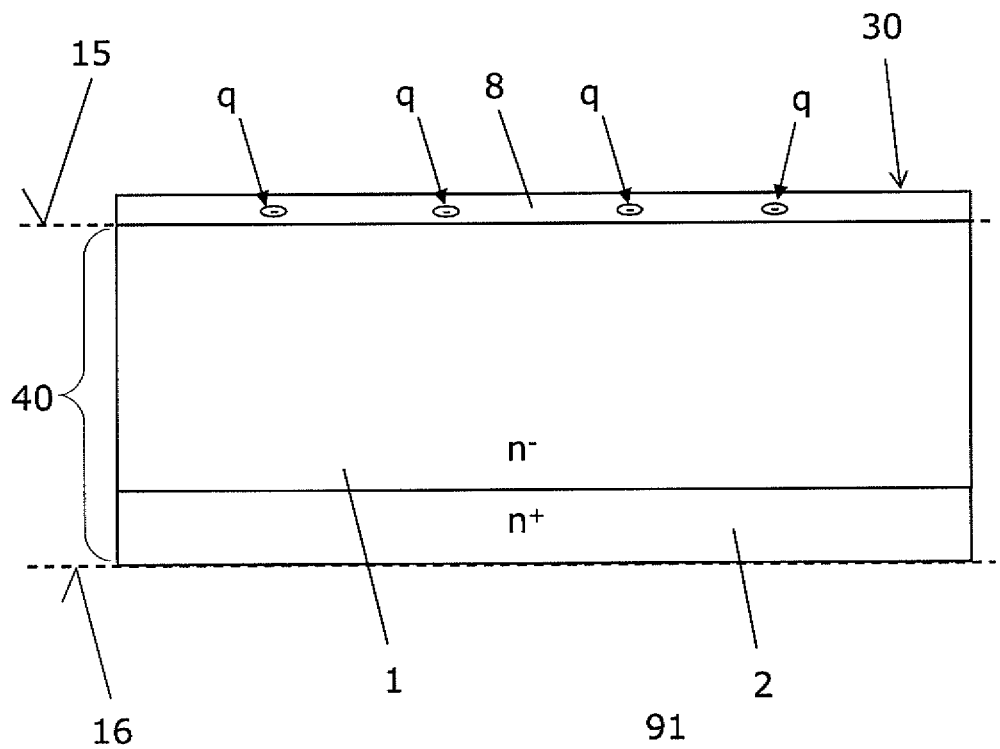

Typically, thermal steps with temperatures from about 700° C. to about 1250° C., more typically from about 800° C. to about 1000° C. are carried out after depositing layers 8b and 8c. Accordingly, a dielectric layer 8 with fixed charges is formed on the main surface 15 and in contact with layer 1. Depending on the desired charge type, the second layer 8b typically includes aluminum or aluminum oxide for forming a negatively charged layer 8 or cesium or cesium oxide to form a positively charged layer 8. The charge type of the fixed charges is equal to the charge type of the majority charge carriers of the first semiconductor region 1. The resulting structure 207 is shown in FIG. 14. Charged dielectric layer 8 and first semiconductor region 1 form a dielectric-semiconductor interface at main surface 15.

Charged layer 8 typically includes a charge carrier density per are of more than about $10^{11}$/cm$^2$, and more typically of more than about $10^{12}$/cm$^2$.

In another embodiment, layers 8a, 8b and 8c form a SiO$_2$—Si$_3$N$_4$—SiO$_2$-sandwich structure with fixed negative charges. In this embodiment, additional thermal annealing steps to form a common layer 8 are typically not carried out. The sandwich structure or stack-structure may include layers having a relative dielectric constant which is higher than about 7 or even 20.

Figure 15:
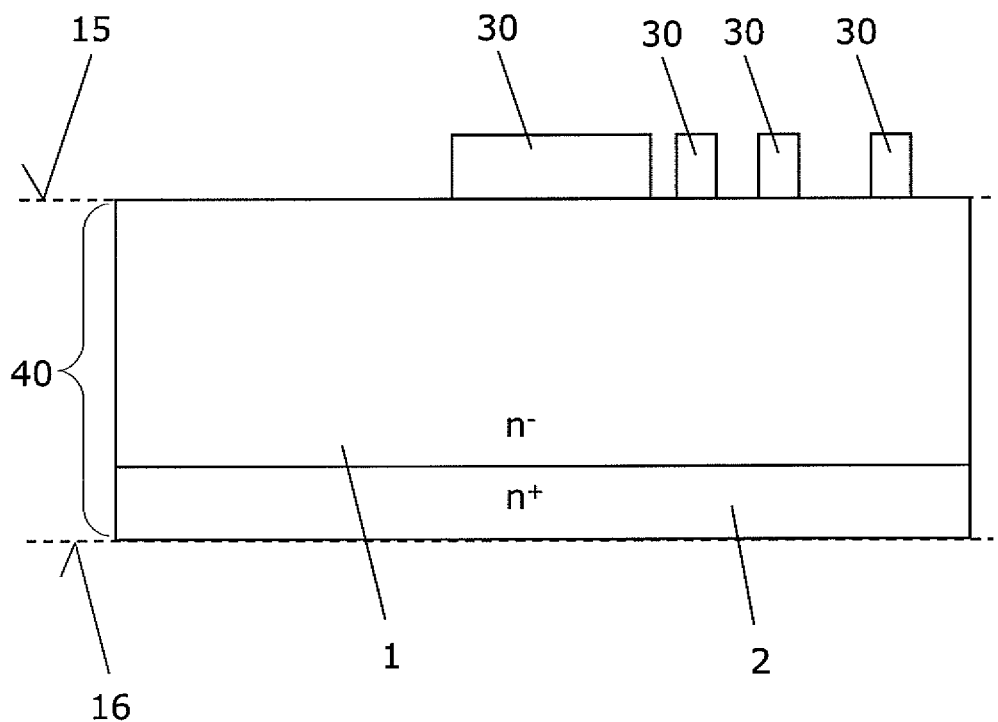

In another embodiment, layer 8b is only formed in a part on layer 8a. This may be achieved by depositing a structured anti-adhesive layer prior to depositing layer 8b and/or by masked etching of charged layer 8 and/or by partially etching of charged layer 8. For example, charged layer 8 may be etched through a mask to main surface 15. Accordingly, different charges regions 30 may be formed by the masked etching process as shown in FIG. 15. Accordingly, the carrier density per area may vary in horizontal direction. In another embodiment, masked etching of charged layer 8 stops prior to reaching main surface 15. This may also be used to vary the carrier density per area in horizontal direction.

Subsequently, a dielectric region 80 is formed on main surface 15, e.g. in a CVD-process or by thermally oxidizing. Dielectric region 80 has typically a lower carrier density per area than charged layer 8, typically less than about $10^{10}$/cm$^2$.

Figure 16:
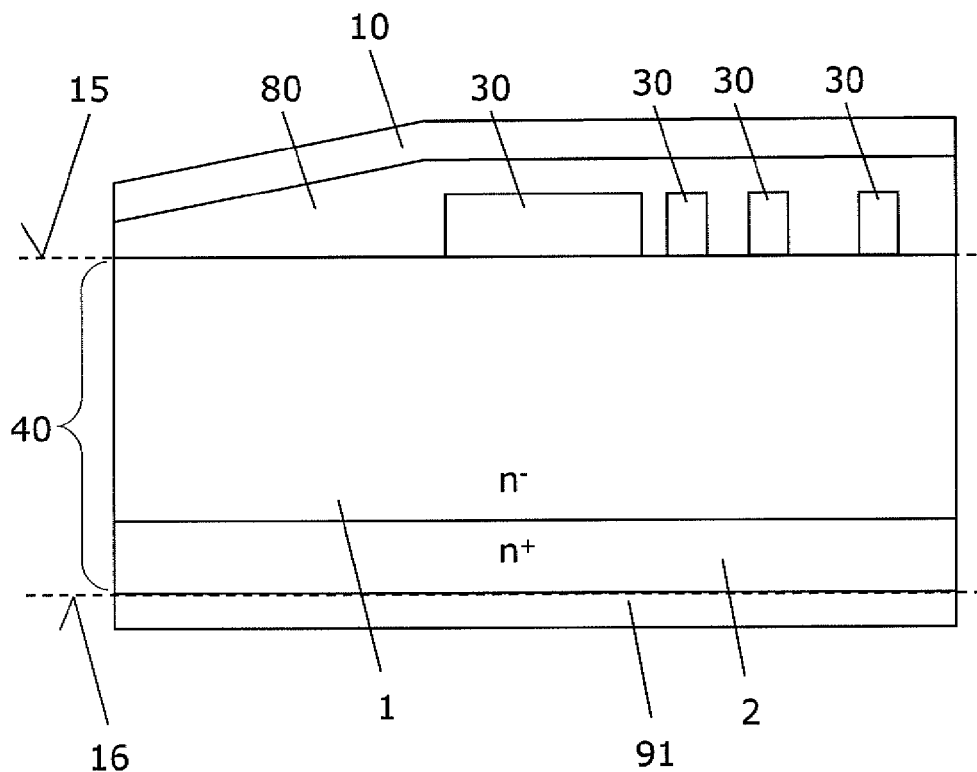

Thereafter, a drain electrode 91 is formed on back surface 16 and a field plate 10 is formed on dielectric region 80, e.g. by depositing of a metal or a highly doped poly-silicon. Field plate 10 is insulated from semiconductor body 40. The resulting semiconductor structure 207 is shown in FIG. 16. Typically, semiconductor structure 207 forms an edge termination structure which is arranged in a peripheral area 127 of a power semiconductor device. The manufacturing processes are typically carried out such that the charges regions 30 and/or the dielectric region 80 are shielded against entrapment of hot majority charge carriers generated in the first semiconductor region 1.

Figure 17:
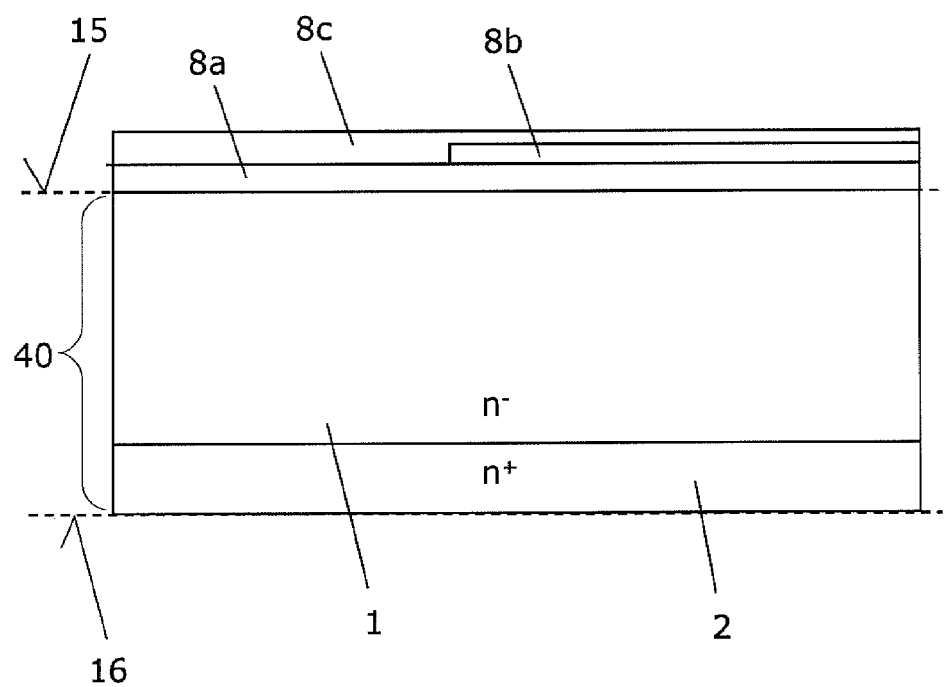

The semiconductor device 207 illustrated in the embodiment of FIG. 17, is similar to the semiconductor device 207 of FIG. 13. However, layer 8b is only partly deposited on layer 8a. This may e.g. be achieved by depositing a structured anti-adhesive layer for the material of layer 8b prior to the ALD-process of forming layer 8b.

Figure 18:
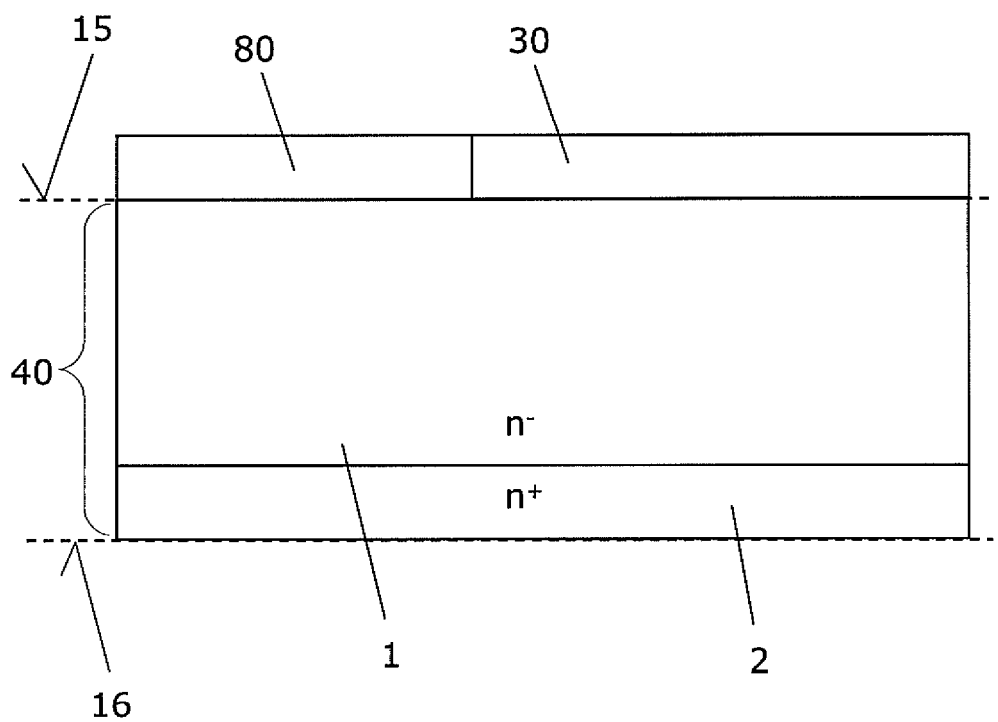

Thereafter, thermal steps are carried out as has been explained with reference to FIG. 14. In so doing, two dielectric regions 30, 80 with different charge carrier density per are formed on main surface 15. Charge dielectric region 30 has typically a higher charge carrier density per area than dielectric region 80. The resulting structure 207 is shown in FIG. 18.

Figure 19:
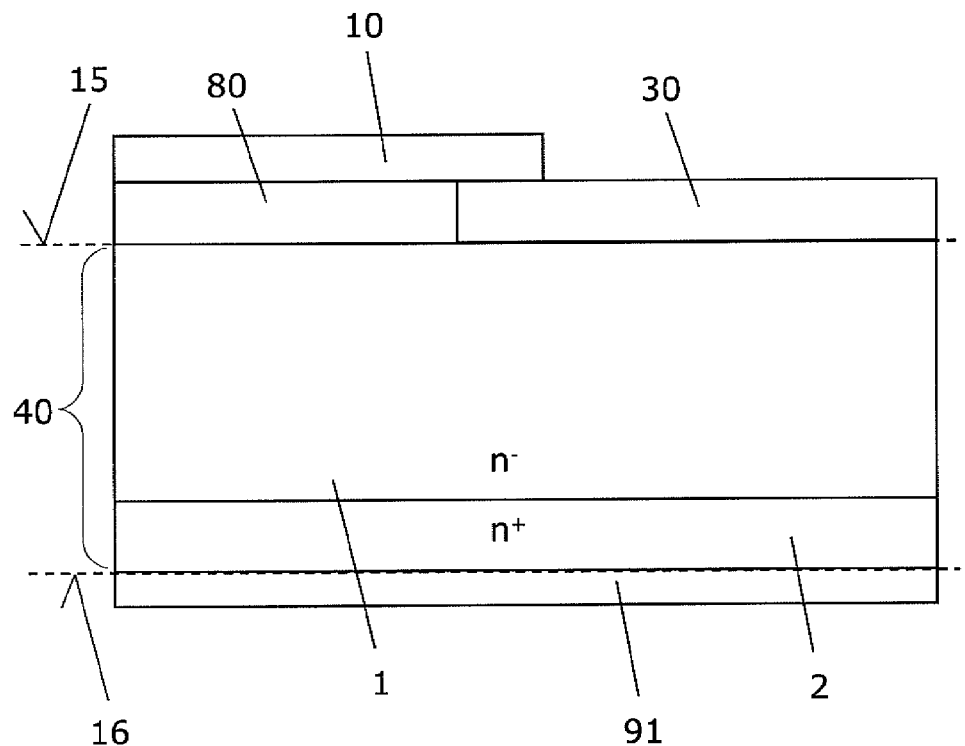

Thereafter, a field plate 10 is formed on dielectric region 80 and a drain electrode 91 is formed on back surface 16. Field plate 10 is insulated from semiconductor body 40. The resulting semiconductor structure 207 is shown in FIG. 19. Typically, semiconductor structure 207 forms an edge termination structure which is arranged in a peripheral area of a power semiconductor device.

In other embodiments, charge dielectric region 30 is formed in a lower portion of a trench and a dielectric region 80 is formed in an upper portion of the trench. The processes of forming charge dielectric region 30 and dielectric region 80 are similar as explained with reference to FIGS. 11 to 19 but are carried out on a trench surface. After forming a trench by etching in semiconductor region 1, a conformal first dielectric layer is formed on semiconductor region 1, at least in the trench. Thereafter, a second layer is formed on the first dielectric layer by atomic layer deposition in a lower portion of the trench. Subsequently, a second dielectric layer is formed on the second layer such that the charge type of the fixed charges is equal to the charge type of the majority charge carriers of the first semiconductor region 1. Thereafter thermal processes are carried out to form a charge dielectric region 30 and a dielectric region 80 in the lower portion and upper portion, respectively, of the trench.

Thereafter, an electrode structure is formed at least in the lower portion of the trench, such that the electrode structure is insulated from the semiconductor body by the charge dielectric region 30. The electrode structure may be a field plate or a gate electrode having a lower portion which is configured to operate as a field plate.

Typically, the trench is formed in an active area of a power semiconductor device. The charge carrier density per area is chosen such that at least the charged dielectric region 30 is shielded against entrapment of hot majority charge carriers generated in the first semiconductor region when the semiconductor device is operated in an avalanche mode. Accordingly, the semiconductor device is protected against hot charge carrier induced device degradation.

It goes with out saying, that the charged dielectric region 30 on the trench may also be formed as a stack of different dielectric layers which include fixed charges at or close to an interface between the stack of different dielectric layers.

Further, p-type body contact regions, p-type body regions, n-type source regions may be formed after or prior to forming charged layer 8.

Thereafter, a source metallization in contact with the source regions and the body contact regions is typically formed by physical vapor deposition (PVD) and/or electroplating.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a semiconductor body, comprising:
an active area and a peripheral area both defining a main surface of the semiconductor body;
an n-type semiconductor layer embedded in the semiconductor body and extending to the main surface in the peripheral area; and
an edge termination structure arranged on the main surface in the peripheral area and comprising a field plate which is insulated against the semiconductor body by a field insulating region, the field insulating region comprising a first dielectric portion and a negatively charged dielectric portion, the first dielectric portion comprising a first maximum charge carrier density per area of negative charges, the negatively charged dielectric portion comprising a maximum charge carrier density per area of negative charges which is larger than the first maximum charge carrier density per area, and the negatively charged dielectric portion being arranged next to at least one of an edge and a step of the field plate.

2. The power semiconductor device of claim 1, wherein the carrier density per area of the negatively charged dielectric portion decreases step-wise or continuously toward the outer border of the edge termination structure.

3. A semiconductor transistor, comprising:
a semiconductor body, comprising:
a first semiconductor region comprising majority charge carriers of a first charge type; and
a dielectric region comprising a first charged dielectric portion and a second charged dielectric portion, the second charged dielectric portion comprising fixed charges of the first charge type, the first charged dielectric portion having a first maximum charge carrier density per area, the second charged dielectric portion having a second maximum charge carrier density per area of the fixed charges that is larger than the first maximum charge carrier density per area;
wherein the first semiconductor region forms an insulator-semiconductor interface at least with the second charged dielectric portion.

4. The semiconductor transistor of claim 3, wherein the semiconductor transistor is a field effect power semiconductor device with an n-type drift region formed by the first semiconductor region.

5. The semiconductor transistor of claim 3, wherein the dielectric region is arranged between the first semiconductor region and at least one of a gate electrode and a field plate.

6. The semiconductor transistor of claim 5, wherein at least one of the gate electrode and the field plate is arranged in a trench which extends into the first semiconductor region.

7. The semiconductor transistor of claim 5, wherein the first semiconductor region extends to a main surface of the semiconductor body, and wherein the field plate is arranged on the main surface.

8. The semiconductor transistor of claim 3, wherein the carrier density per area is configured such that the dielectric region is shielded against hot majority charge carriers generated in the first semiconductor region.

9. The semiconductor transistor of claim 3, wherein the second charged dielectric portion is arranged next to a region of highest electron current in an avalanche mode of the semiconductor transistor.

10. The semiconductor transistor of claim 3, wherein the semiconductor transistor is a field effect transistor further comprising a channel region, and wherein the second charged dielectric portion is spaced apart from the channel region.

11. The semiconductor transistor of claim 3, wherein the second charged dielectric portion is formed as a stack of layers comprising different dielectric materials.

12. The semiconductor transistor of claim 11, wherein the stack comprises a layer having a relative dielectric constant that is higher than about 7.

* * * * *